(12) United States Patent
Kendall

(10) Patent No.: US 6,252,339 B1
(45) Date of Patent: Jun. 26, 2001

(54) REMOVABLE BOMBARDMENT FILAMENT-MODULE FOR ELECTRON BEAM PROJECTION SYSTEMS

(75) Inventor: Rodney Arthur Kendall, Ridgefield, CT (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/156,544

(22) Filed: Sep. 17, 1998

(51) Int. Cl.[7] .................................................. H01J 1/00
(52) U.S. Cl. ........................ 313/237; 313/282; 219/121; 219/121.12; 219/121.27
(58) Field of Search ................................ 313/271, 276, 313/275, 341, 279, 237; 250/310, 492.1; 219/121.27, 121.12

(56) References Cited

U.S. PATENT DOCUMENTS

| | | | |
|---|---|---|---|
| 3,470,412 | * 9/1969 | Sakamoto | 313/237 |
| 3,602,685 | * 8/1971 | Itoh | 219/121.12 |
| 3,636,346 | * 1/1972 | Akahori et al. | 313/282 |
| 3,723,791 | * 3/1973 | Stocklein | 313/237 |
| 3,740,554 | * 6/1973 | Morgan, Jr. | 313/63 |
| 3,761,676 | * 9/1973 | McFarland | 219/121 |
| 3,949,265 | * 4/1976 | Holl | 313/360.1 |
| 4,057,746 | * 11/1977 | DUmonte | 313/237 |
| 4,468,586 | 8/1984 | Hohn | 313/336 |
| 4,486,684 | 12/1984 | Hohn | 313/336 |
| 4,521,902 | * 6/1985 | Peugeot | 378/138 |
| 4,583,023 | 4/1986 | Friedman et al. | 313/346 |
| 4,591,754 | 5/1986 | Hagiwara et al. | 313/336 |
| 4,634,921 | 1/1987 | Williams et al. | 313/342 |
| 4,833,362 | * 5/1989 | Crewe | 313/311 |
| 4,900,982 | * 2/1990 | Kolpin | 313/452 |
| 4,998,004 | * 3/1991 | Lawrence et al. | 219/121.12 |
| 5,149,934 | * 9/1992 | Haynie et al. | 219/121.27 |
| 5,623,148 | 4/1997 | Wenzel et al. | 250/427 |
| 5,686,785 | 11/1997 | Movchan et al. | 313/453 |
| 5,763,880 | 6/1998 | Nisiyama et al. | 250/310 |

FOREIGN PATENT DOCUMENTS

1205208 * 11/1965 (DE).

* cited by examiner

Primary Examiner—Nimeshkumar D. Patel
Assistant Examiner—Mariceli Santiago
(74) Attorney, Agent, or Firm—Graham S. Jones, II

(57) ABSTRACT

This method and apparatus permit installing and removing an electron beam generating element comprising a filament or a cathode in a rapidly replaceable module. The apparatus is an electron gun system having an electron gun enclosure, a feed-through element extending through the electron gun enclosure, an electron beam generating element housed within a filament module housing and connected to the feed-through element, an electron gun column and a connector port in the gun enclosure for direct removal and replacement of the filament. The feed-through element and the filament module housing are removed, through the connector port, from the gun enclosure and then the filament is removed and replaced. A load-lock is provided above the connector port to avoid venting into the gun. A bellows can be used to facilitate removal of the gun with minimal exposure to ambient atmospheric gases.

16 Claims, 4 Drawing Sheets

REMOVABLE BOMBARDMENT FILAMENT-MODULE FOR ELECTRON BEAM PROJECTION SYSTEMS

BACKGROUND OF THE INVENTION

1. Field of the Invention

This invention relates to electron beam projection systems and more particularly to methods and apparatus for replacement of electron beam projection system components such as electrodes, i.e. filaments, and cathodes.

2. Description of Related Art

U.S. Pat. No. 4,634,921 of Williams et al. for "Thermionic Cathode Heater" describes a cathode for producing and electron beam which includes a cathode heater comprising a straight wire inside a conducting circular cylinder. The cylinder in turn is located within a cathode which is heated by current through the straight wire flowing in one direction and then returning through the cylinder. The cathode is composed of a conductive material such as sintered tungsten.

U.S. Pat. No. 4,583,023 of Friedman et al. for "Electron Beam Heated Thermionic Cathode" describes an electron beam generator or the like initially heated by a suitable heating means such as an electrical hot plate to a temperature sufficient for low level electron emission from its rear surface. A sustainer voltage is applied between the cathode and the hot plate to draw electron flow of a "back electron beam" from the cathode to the hot plate through the space between them. The back electron beam heats the hot plate to a temperature sufficient to raise the temperature of the closely spaced cathode to the desired emission temperature. This heater process is ended at that point since the heating is used only initially until the desired emission temperature is reached.

SUMMARY OF THE INVENTION

In the past the electrodes which produced electron beams have included the terms "cathode" and "filament" which may have been used interchangeably. In the case of the present invention, the devices being employed include a filament which generates a primary electron beam which heats a cathode which produces a secondary high energy electron beam directed into the column of an electron beam projection system. The problem dealt with by this invention has to do with the replacement of components such as filaments in an electron beam column, when necessary, without requiring venting the system.

In accordance with this invention, a method and apparatus are provided which permit installing and removing an element such as an electron beam generating component such as a filament or cathode element module from an electron gun without having to remove the electron gun from the electron column. The feed-through connector is removed from the connector port in the gun and then the element module is removed from the connector port. Removal of the feedthrough element from the top of the gun provides easy access to the module. The element is replaced through an opening made accessible by removing the feedthrough element. Then the element is simply lifted out of the gun and the new element is placed into position. To facilitate quick connection, the element module is installed in the electron gun in a way that all electrical connections to the support plates are automatic.

In another aspect of this invention, a load-lock can be provided above the connector port to avoid venting into the gun. A bellows between the feedthrough element and the top of the load-lock chamber can facilitate removal of the feedthrough without exposure of the gun to ambient atmospheric gases.

BRIEF DESCRIPTION OF THE DRAWINGS

The foregoing and other aspects and advantages of this invention are explained and described below with reference to the accompanying drawings, in which:

FIG. 1A shows a portion of an EBPS including an electron gun mounted on top of an EBPS electron column in a manner considered by applicant for such a system, which is being replaced by the present invention because of the problem encountered by the inventor.

FIG. 1B shows an exploded view of the device of FIG. 1A with some of the parts disassembled with dotted lines indicating where the parts were located prior to disassembly. The device of FIG. 1A has been disassembled to remove and replace a filament in the EBPS but the problem encountered by the inventor is that when the EBPS is disassembled as shown in FIG. 1B, the electron gun is exposed to ambient atmospheric gases which delays resumption of operation of the EBPS until the ambient gases can be removed.

FIGS. 3A and 3B show partially schematic sectional elevational views of a second embodiment of this invention which makes it unnecessary to vent the gun to change a filament module. In this case the electron gun is extended upwardly by addition above the gun on the top plate above the feedthrough of a load lock. The load lock includes bellows and valves which are operated during to reduce gas problems when changing a filament module containing a filament or the like.

FIGS. 3A and 3B.

PROBLEM

Figure 1A:
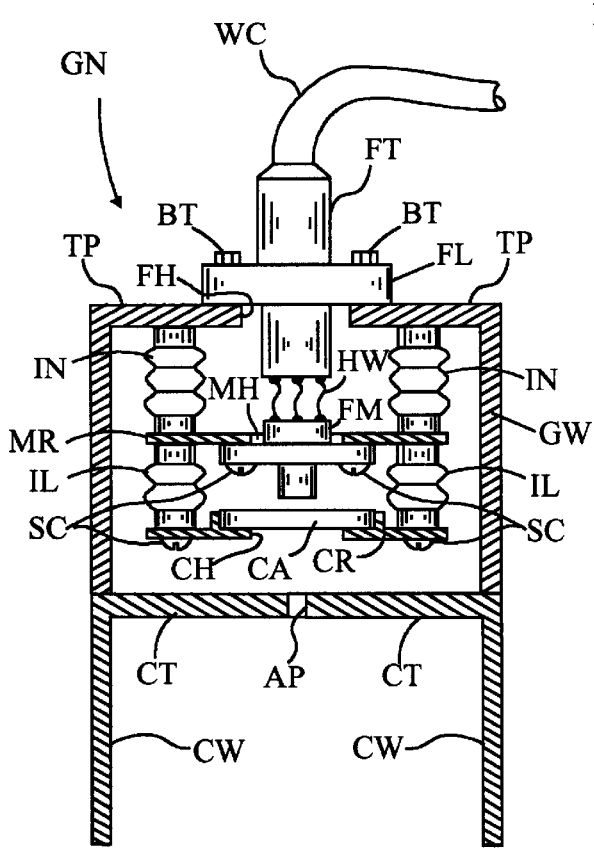
FIGS. 1A and 1B illustrate a problem encountered by the inventor which is solved by the present invention when changing a component in an Electron Beam Projection System (EBPS).

FIG. 1A shows a portion of an Electron Beam Projection System (EBPS) including an electron gun GN mounted on top of an EBPS electron column COL in a manner considered by applicant for such a system. FIG. 1A shows a filament module FM which houses a primary filament FIL seen in FIG. 4, which produces a primary electron beam. The primary filament is light in weight and comprises a wire which has a relatively short life. The primary filament in the filament module FM projects a primary electron beam onto the back of a cathode CA which is supported below the filament module FM. The energy introduced into the back of the cathode CA causes generation of an electron beam by the cathode CA. The energy introduced to the back surface of the cathode CA from the primary electron beam generated by the filament FIL causes heating which stimulates the cathode CA to emit electrons forming the secondary electron beam.

This invention is directed to overcoming the problems with electron guns which use elements which need to be replaced. Such elements include filaments used for electron beam bombardment with a primary electron beam element employed to energize emission of electrons from a cathode. In the case of a filament used for energizing a cathode, the small filament has a limited lifetime necessitating periodic replacement of that element. In accordance with this invention, the element which can comprise a filament or a cathode is replaced by a new procedure involving replacement of a filament module FM which contains the element such as a filament FIL without introducing unwanted gases into the system or minimizing introduction of such unwanted gases.

A process originally considered, during the development of this invention, called for replacement of a filament module FM by removing an electron gun GN seen in FIG. 1A from the electron column COL in order to gain access to a filament module FM which needed to be replaced. However, removal of the gun GN would require venting the gun GN, and possibly venting the electron column COL, also. The result of such a procedure would be an unacceptably long time for making a repair due to the disruption to the system by introduction of such unwanted gases into the column COL and the gun GN. Also, an excessive amount of time would be required to restore the electron column COL to a stable vacuum after exposing the internal surfaces to atmosphere.

The gun GN includes an enclosure comprising a cylindrical wall GW and a top plate TP with a feed-through hole FH therethrough. A high voltage feed-through connector FT is inserted through hole FH. Connector FT is connected to high voltage wiring cable WC, and the connector FT is fastened to the top plate TP of gun GN by threaded bolts BT which pass through a mounting flange FL on the base of connector FT into threaded holes in the top plate TP.

The electron column COL includes a top plate CT and column walls CW. The top plate CT of the electron column COL includes an E-beam aperture AP for the secondary electron beam to be directed from the gun GN into the interior of electron column COL defined by column walls CW.

Secured to the bottom surface of the top plate TP are shown two insulators IN (one or several insulators) carrying a mounting ring MR, which is secured to the lower surface of insulators IN. Mounting ring MR has a mounting hole MH which is shown coaxially aligned with the feed-through hole FH and the aperture AP.

An EBPS filament module FM is fastened by screws SC to the bottom of mounting ring MR with its top surface exposed to the bottom of the gun GN. The top surface of filament module FM includes a number of contacts which are electrically connected by hard wires HW to the bottom contact terminals of feed-through connector FT.

Secured to the bottom surface of the mounting ring MR are shown two more insulators IL (one or several insulators) carrying a cathode ring CR, which is secured to the lower surface of insulators IL by more screws SC. Cathode ring CR has a cathode hole CH which is shown coaxially aligned with the feed-through hole FH and the aperture AP.

An EBPS cathode CA is secured to the top of cathode ring CR with its top surface exposed to the bottom of the gun GN. The top surface of filament module FM includes a number of contacts which are electrically connected by hard wires HW to the bottom contact terminals of feed-through connector FT.

Figure 1B:
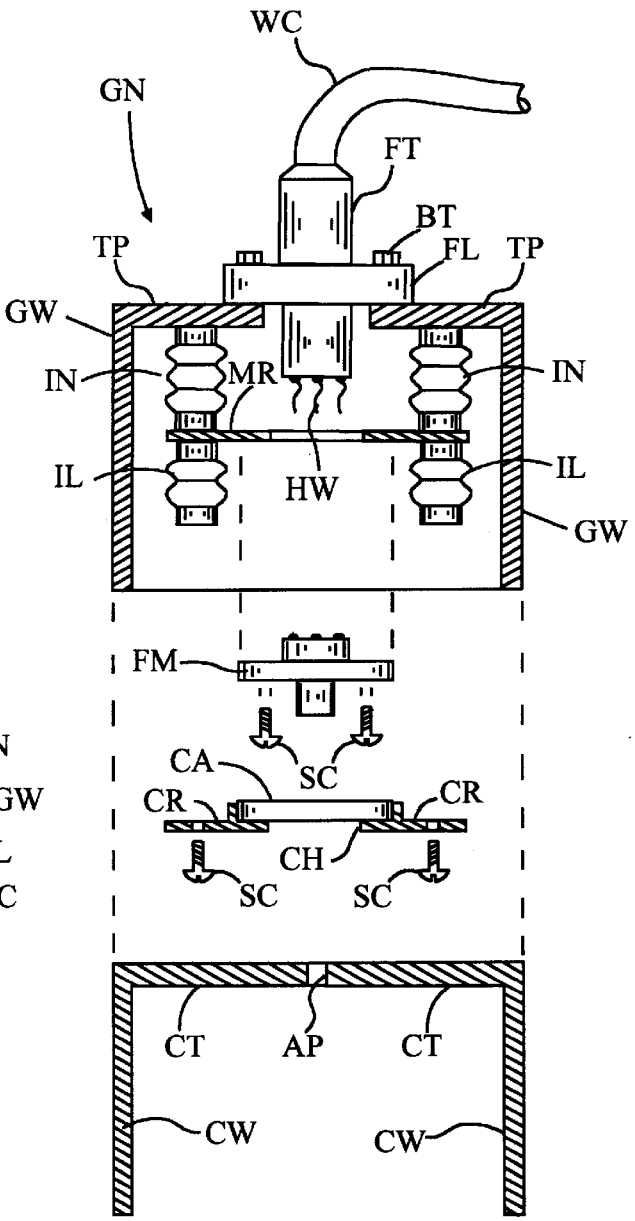

FIG. 1B shows an exploded view of the device of FIG. 1A with some of the parts disassembled with dotted lines indicating where the parts were located prior to disassembly. To replace the filament module FM, the gun GN is moved as shown in FIG. 1B away from the electron column COL and then the screws SC are removed and the hard wires HW are removed from the top of the filament module FM permitting the filament module to be separated from the gun GN and replaced. This causes the space within the gun GN to be exposed to the atmosphere and in addition there is the greater problem that the leads to exposure of the aperture AP to ambient conditions so that atmospheric gases may pass through aperture AP into the electron column COL.

DESCRIPTION OF THE PREFERRED EMBODIMENT

Figures 2A, 2B:
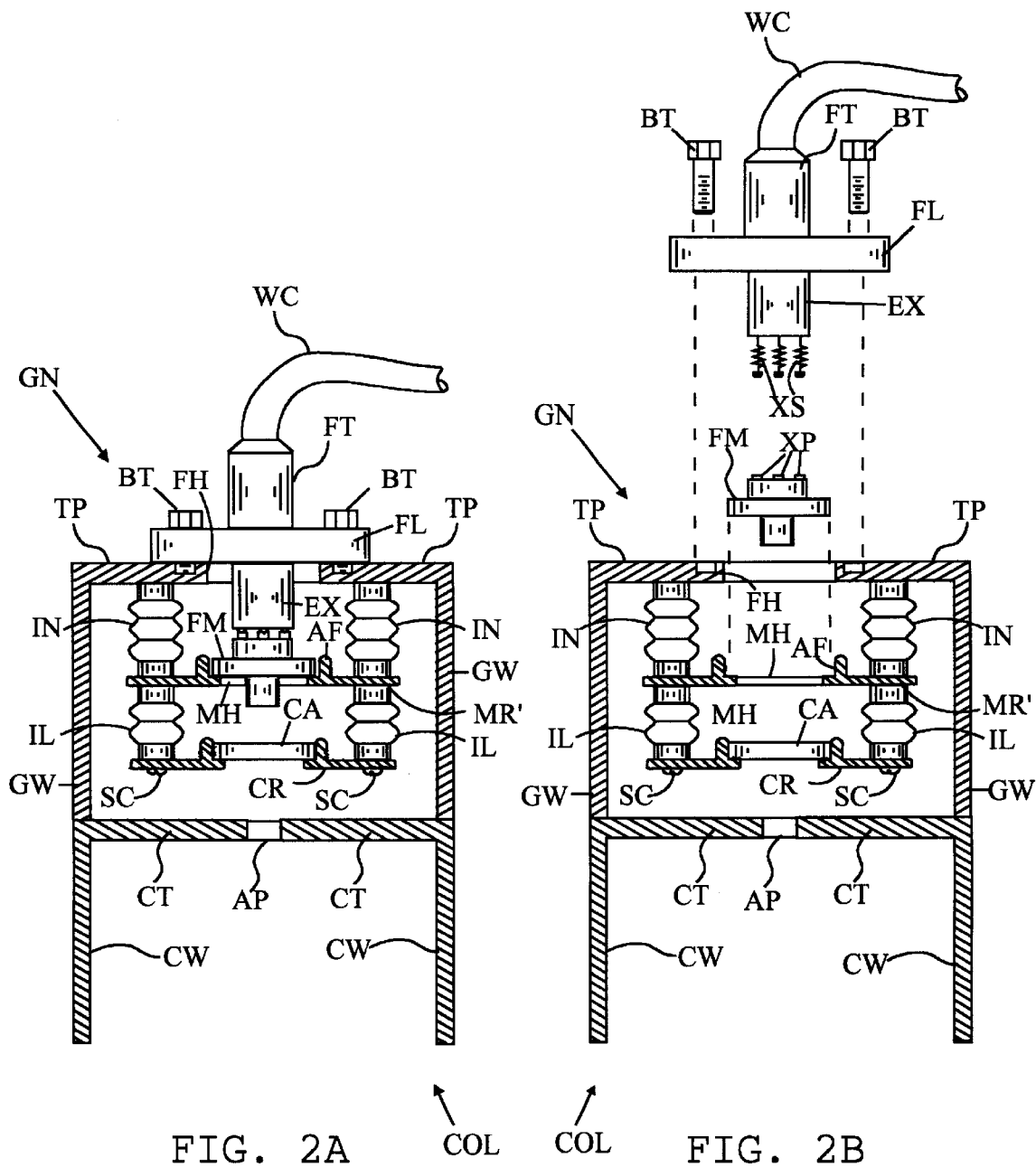
FIGS. 2A and 2B, which are modifications of FIGS. 1A and 1B respectively, show partially schematic sectional elevational views of first embodiment of this invention which solves the problems of FIGS. 1A and 1B involves replacing a filament module while venting the gun with dry nitrogen gas when an existing filament seen in FIG. 4 is due for replacement.

FIGS. 2A and 2B, 3A and 3B all show a portion of an Electron Beam Projection System (EBPS) in accordance with two embodiments of this invention including an electron gun GN mounted on top of an EBPS electron column COL which are modifications of FIG. 1A. In accordance with this invention, as illustrated by FIGS. 2A and 2B, and, 3A and 3B various methods and apparatus are provided which permit installing and removing the filament module FM from the gun GN without having to remove the electron gun GN from the column COL.

To facilitate quick connection, the filament module FM is installed in the electron gun GN in such a way that all electrical connections to the support plates, and therefore to the filament, are made automatically without requiring solder joints and the like. As shown in FIGS. 2B and 3B, on the bottom of the feed-through FT are standard spring connections XS which overlie the connection pads XP, as will be well understood by those skilled in the art.

Figure 4:
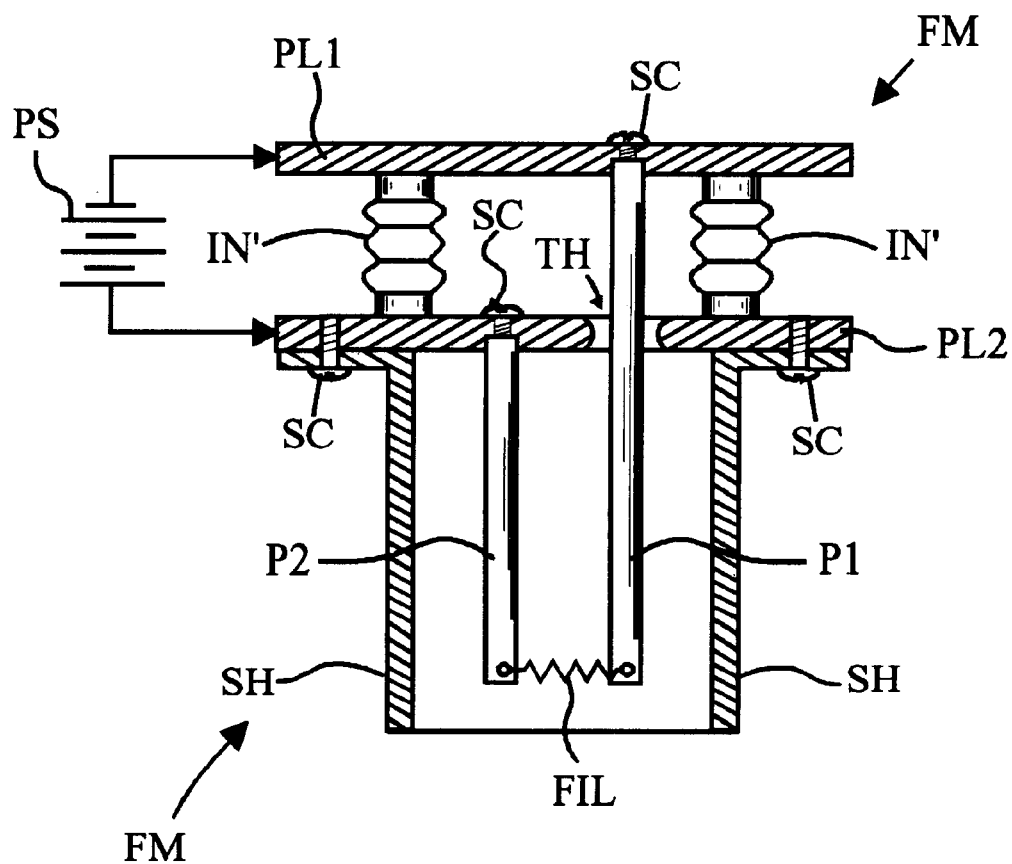
FIG. 4 shows a detailed sectional view of the filament module FM of FIGS. 2A and 2B.

A first embodiment of this invention shown in FIGS. 2A and 2B involves replacing a filament module FM when an existing filament FIL seen in FIG. 4 is due for replacement by first venting the electron gun GN with dry nitrogen gas, as will be well understood by those skilled in the art.

Since the filament module FM in FIG. 2A is located directly under an electrical feed-through FT, in the embodiment of FIGS. 2A and 2B, the feed-through FT and filament module FM are removed through feed-through hole FH allowing access to the filament module FM for replacement thereof. The dry nitrogen gas flow, (not shown since the nitrogen gas inlet is located lower on the column COL) is left on during this process to prevent ambient air from entering the gun GN through feed-through hole FH. Then the old filament module FM is removed and the new filament module FM is installed. Electrical feed-through FT is reinstalled making automatic connection with the filament module FM. The nitrogen gas flow is turned off and the gun GN is pumped down to high-vacuum. During this process the electron gun GN is not removed from the electron column COL.

FIG. 2A shows an Electron Beam Projection System (EBPS) in accordance with this invention including an electron gun GN mounted on top of an EBPS electron column COL in the conventional manner. The gun GN includes an enclosure comprising a cylindrical wall GW and a top plate TP with a feed-through hole FH therethrough for insertion of a high voltage feed-through connector FT. Connector FT is connected to high voltage wiring cable WC, and connector FT is fastened to the top plate TP of gun GN by bolts BT.

The electron column COL includes a top plate CT and column walls CW. The top plate CT of the electron column COL includes an E-beam aperture AP for an electron beam to be directed from a cathode CA in the gun GN into the interior of electron column COL.

Secured to the bottom surface of the top plate TP of the gun GN are two insulators IN carrying a mounting ring MR', which is bonded to the lower surface of insulators IN. Ring MR' has a mounting hole MH which is coaxially aligned with the feed-through hole FH and aperture AP with an alignment flange AF which aligns the filament module FM in its proper location in the gun GN.

Secured to the bottom surface of the mounting ring MR' are two lower insulators IL carrying a cathode mounting ring CR, which is secured to the lower surface of insulators IL by screws SC. Ring CR has a mounting hole which is coaxially aligned with the feed-through hole FH and aperture AP with an alignment flange which retains the cathode CA on cathode mounting ring CR in its proper location in the gun GN. The top of cathode CA is positioned to be energized by a primary electron beam from the filament FIL located in filament module FM as shown in FIG. 4.

The EBPS filament module FM in accordance with this invention rests on the annular ring formed by the alignment flange AF on the surface of mounting ring MR'. Thus no screws are required to fasten the filament module FM to the mounting ring MR'. Module FM has its top surface exposed to the chamber enclosed within the gun GN. The top surface of filament module FM includes a number of contacts which are electrically connected quickly to the spring connections XS on the bottom of feed-through connector FT. The electrical contacts supply electrical energy to the filament FIL for generating the primary electron beam which energizes the cathode CA.

Referring to FIG. 2B, to replace the filament module FM, the bolts BT are removed and then the feed-through FT is raised from the electron column COL. Then the filament module FM is removed and the new filament module FM is quickly installed; and in seconds, the feed-through FT is reinstalled on top of gun GN.

Figure 3A:
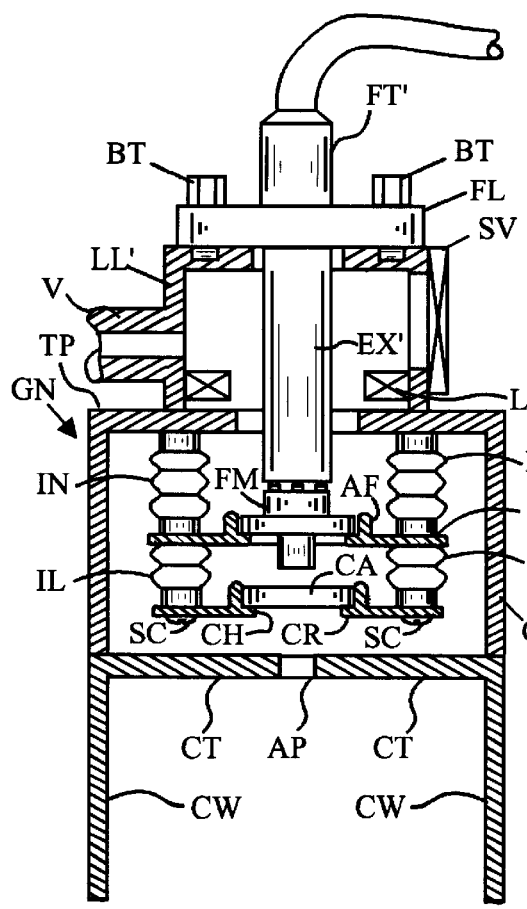
Figure 3B:
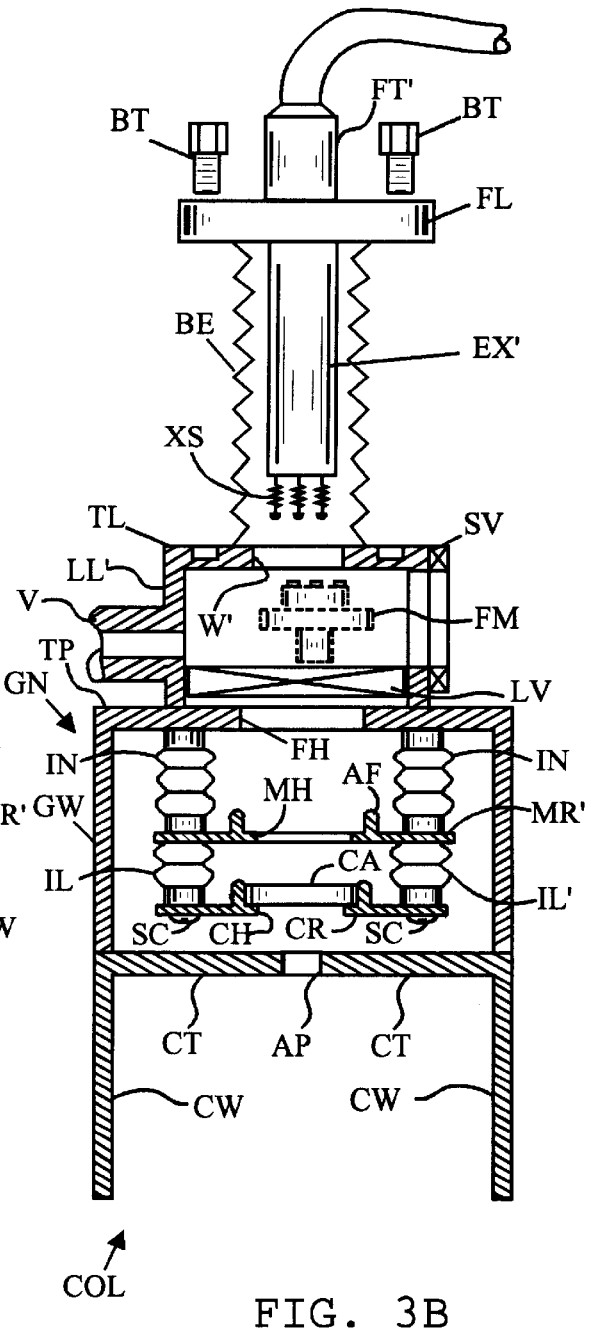

The second embodiment of this invention is shown in FIGS. 3A and 3B. In this embodiment it is not necessary to vent the gun GN to change a filament module FM. In this case the electron gun GN is extended upwardly by addition above the gun GN on the top plate TP, above the feedthrough hole of a vacuum load-lock LL' and use is made of a conventional vacuum manipulator (not shown) inside the load lock for removal of the filament module FM through a valve SV on the side of the load-lock LL'. The load-lock chamber LL has a circular cross section adapted for providing closure by disk shaped gate valves SV and LV at the side and bottom of the load-lock, as described below.

When an existing filament module FM is due for replacement, the manipulator is used to retract the filament module FM from the gun GN and then the manipulator is used to move the filament module FM up into the load-lock LL', which is under vacuum.

The valve LV between the load-lock LL' and the gun GN is then closed and the load-lock LL' is vented. The filament module FM is then removed from the load-lock LL' through the side valve SV of the load-lock LL'. The replacement filament module FM is placed in the load-lock LL' which is then pumped down to the high-vacuum range. The valve LV between the gun GN and the load-lock LL' is opened and the manipulator is used to install the new filament-module FM into the gun GN. Since all electrical connections to the filament-module are automatic, with this embodiment there is no need to vent or remove the gun. The load-lock LL' includes a vacuum port V for evacuation of the chamber with the load-lock LL'. The valves SV and UV are conventional gate or shutter type valves (respectively located at the side and below the vacuum port V) which have movable disk shaped plates which can be slid across the opening in the load-lock chamber to close the annular opening into the load-lock chamber. The conventional shutter valves are shown in schematic form.

The filament module FM of FIGS. 2A and 2B and FIGS. 3A and 3B is shown in detail in FIG. 4. Module FM consists of the two support plates first plate PL1 on top in FIG. 4 and second plate PL2 below plate PL1. Plates PL1 and PL2 are separated by high voltage electrical insulators IN' capable of withstanding the filament heating voltage which must be sufficient to produce the primary electron beam which energizes the cathode CA. Insulators IN' also secure plates PL1 and PL2 together (by conventional fastening means not shown for convenience of illustration). Attached to each plate PL1 and PL2 is the proximal end of a filament support (mounting) post P1 and P2 respectively. Posts P1 and P2 are secured to plates PL1 and PL2 respectively by threaded screws SC which pass through plates PL1 and PL2 into threaded holes in the proximal ends of posts P1 and P2 which are secured in counterbores in the lower surfaces of plates PL1 and PL2. Post P1 passes through a through hole TH in plate PL2 with sufficient clearance to prevent a discharge of electrons at the high voltages employed, in the vacuum within the gun GN. The filament FIL is mounted to the distal ends of posts P1 and P2 so that one end of the filament FIL is connected to each of the posts P1 and P2. This construction allows the filament module FM to be a separate and self-contained element.

Details of the load-lock LL' and the valves are shown in FIGS. 3A and 3B. The flange FL is connected by a bellows seal BE (shown in schematic form as will be well understood by those skilled in the art) to the top plate TL of the load-lock LL'. The bellows seal BE allows the feed-through FT to be removed from its installed position without venting the gun GN.

The side gate valve SV is provided on the side of the load-lock LL' for access to the filament module FM when the feed-through is in raised position, as shown, to remove the filament module with manipulating apparatus which can pick up the module FM and remove it through the port FH (feed-through hole) and the side valve SV. Use of a manipulator (not shown) and sequential operation of valves and application of a vacuum to the load-lock LL' allow removal and replacement of the filament module FM with venting the gun GN.

In FIG. 3B, the filament module FM is shown in phantom partially removed but remaining temporarily in the load-lock LL' after the lower valve LV has been closed.

This design is better because the Mean Time of Replacement (MTR) of filaments is greatly reduced.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An electron gun system including:

an electron gun enclosure, with a feed-through element extending through a wall of said electron gun enclosure, an electron beam generating element housed within a filament module housing which is contained within said electron gun enclosure, said electron beam generating element being electrically connected to said feed-through element, an electron column including a column top plate and column walls, the column top plate including an aperture therethrough for an electron beam, and the gun enclosure being located above the column top plate, a port in said gun enclosure, said port including means for permitting direct removal of and replacement of said feed-through element through said port separate from said filament module housing and for permitting separate removal of said filament module housing from said electron gun enclosure without opening said electron column, said filament module housing and said feed-through element having spring-biased elements for automatically interconnecting electrically for quick installation and removal of said feed-through element from contact with said filament module housing, and mounting means secured to said electron gun enclosure for supporting said filament module housing without fasteners within said electron gun enclosure.

2. The electron gun of claim 1 wherein including:

a load-lock being provided on said gun as an access to said port, and a vent being provided between valve elements of said load-lock.

3. An electron gun system including:

an electron gun enclosure, with a feed-through element extending through a wall of said electron gun enclosure, an electron beam generating element housed within a filament module housing which is contained within said electron gun enclosure, said electron beam generating element being connected to said feed-through element, an electron column including a column top plate and column walls, said column top plate including an aperture therethrough for an electron beam, and said gun enclosure being located above the column top plate, said gun enclosure being located above the column top plate, a port in said gun enclosure, said port including means for permitting direct removal of and replacement of said feed-through element through said port and for permitting removal of said filament module housing without opening said electron column, said electron beam generating element and said filament module housing being accessible through said port into a chamber connected to said electron gun enclosure with said chamber having a chamber top plate, and means being provided above said column top plate for venting said chamber to prevent introduction of contaminating gases into said gun during removal of said filament module housing.

4. An electron gun in accordance with claim 3 wherein a filament is housed in said filament module housing and said filament module housing rests upon a ring in said gun enclosure.

5. An electron gun in accordance with claim 3 wherein:

said filament module housing and said feed-through element include spring-biased means for automatically interconnecting electrically.

6. An electron gun in accordance with claim 3 including:

means being provided for venting said gun during removal of said filament module, and said filament module housing and said feed-through element including spring-biased means for automatically interconnecting electrically.

7. An electron gun in accordance with claim 3 wherein a load-lock aligned with said electron column is provided on said gun as an access to said port.

8. An electron gun in accordance with claim 3 wherein:

said filament module housing and said feed-through element are rapidly and automatically connected electrically, and a load-lock aligned with said electron column is provided on said gun as an access to said port.

9. An electron gun in accordance with claim 3 wherein:

a load-lock aligned with said electron column is provided on said gun as an access to said port, and a vent is provided between valve elements of said load-lock.

10. An electron gun system including:

an electron gun enclosure, with a feed-through element extending through a wall of said electron gun enclosure, an electron beam generating element housed within a filament module housing which is contained within said electron gun enclosure, said electron beam generating element being connected to said feed-through element, an electron column including a column top plate and column walls, said column top plate including an aperture therethrough for an electron beam, and said gun enclosure being located above the column top plate, said gun enclosure being located above the column top plate, a port in said gun enclosure, said port including means for permitting direct removal of and replacement of said feed-through element through said port and for permitting removal of said filament module housing without opening said electron column, said electron beam generating element comprises a filament producing a primary electron beam directed at the back side of a cathode, said cathode being located between said electron beam generating element and an aperture in an electron beam column, and said cathode comprising means for providing a secondary electron beam in said electron beam column, means for rapidly and automatically connecting said filament module housing and said feed-through element electrically, a load-lock aligned with said electron column is provided on said gun as an access to said port, and a vent is provided between valve elements of said load-lock.

11. A method for separate removal of a feed-through element and a filament module housing from an electron gun enclosure which provides an electron beam to an electron column, said feed-through element extending through a wall of said electron gun enclosure, and said filament module housing being contained within said gun connected to said feed-through element, comprising the steps of providing a barrier between said column and said gun with an aperture for admission of an electron beam from said gun into said column, and directly removing and replacing said feed-through element through an access port in said wall of said gun and separate removal of said filament module housing through said port providing said filament module housing and said feed-through element with spring-biased elements for automatically interconnecting electrically for quick installation and removal of said feed-through element from contact with said filament module housing, and providing mounting means secured to said electron gun enclosure for supporting said filament module housing without fasteners within said electron gun enclosure.

12. The method of claim 11 including the step of venting said gun during removal of said module.

13. The method of claim 11 including the step of operating a load-lock provided on said gun aligned with said column as an access to said port for directly removing said module.

14. The method of claim 11 including the steps as follows:

operating a load-lock provided on said gun as an access to said port, and operating a vent provided between valve elements of said load-lock.

15. The method of claim 11 wherein said element comprises a filament producing a primary electron beam directed at the back side of a cathode, said cathode being located between said element and an aperture in an electron beam column, said cathode comprising means for providing a secondary electron beam in said electron beam column, including the steps as follows:

operating a load-lock provided on said gun as an access to said port for direct access to said module for removal and replacement thereof, and operating a vent provided between valve elements of said load-lock.

16. The method of claim 11 wherein said electron beam generating element comprises a filament element, said method includes housing said filament element in said filament module housing and said filament module housing is accessible and removable through said port, said filament module housing and said feed-through element are rapidly and automatically connected electrically, operating a load-lock provided on said gun as an access to said port, and operating a vent provided between valve elements of said load-lock.

* * * * *